(12) United States Patent
Johnston (10) Patent No.: US 8,188,685 B1
(45) Date of Patent: May 29, 2012

(54) LIGHT-GENERATING SYSTEM

(76) Inventor: John F. Johnston, Paris (CA)

(*) Notice: Subject to any disclaimer, the term of this patent is extended or adjusted under 35 U.S.C. 154(b) by 117 days.

(21) Appl. No.: 12/813,160

(22) Filed: Jun. 10, 2010

Related U.S. Application Data (60) Provisional application No. 61/185,731, filed on Jun. 10, 2009.

(51) Int. Cl.
*G05F 1/00* (2006.01)
*H01L 27/14* (2006.01)

(52) U.S. Cl. ..... 315/309; 315/291; 315/247; 315/185 S; 315/312; 362/800; 362/373; 362/546; 362/547

(58) Field of Classification Search ............. 362/580, 362/547, 218, 294, 345, 373, 800–812; 315/149–159, 307–326, 185 S, 291, 224, 315/247

See application file for complete search history.

(56) References Cited

U.S. PATENT DOCUMENTS

| | | | |
|---|---|---|---|
| 6,028,694 A | 2/2000 | Schmidt | |
| 7,049,761 B2 | 5/2006 | Timmermans et al. | |
| 7,521,872 B2 * | 4/2009 | Bruning | 315/158 |
| 7,695,161 B2 | 4/2010 | Zhang et al. | |
| 7,712,918 B2 | 5/2010 | Siemiet et al. | |
| 7,722,217 B2 | 5/2010 | Chen | |
| 7,722,221 B2 | 5/2010 | Chae | |
| 2011/0050100 A1 * | 3/2011 | Bailey et al. | 315/35 |

* cited by examiner

*Primary Examiner* — Tuyet Thi Vo (57) ABSTRACT

A light-generating system including a LED load array having a number of light-emitting diodes, and a heat sink on which the LED load array is mounted. The system also includes a power control unit electrically connected to the power source and the LED load array, for converting input electrical power to output electrical power and controlling voltage and current of the output electrical power provided to the LED load array, and a temperature detector subassembly adapted for sensing a heat sink temperature of the heat sink. The temperature detector subassembly monitors the heat sink temperature and transmits a control signal to the power control unit upon determining that the heat sink temperature differs from a preselected temperature by more than a preselected minimum difference. Upon receipt of the control signal, the power control unit changes the voltage of the output electrical power accordingly.

8 Claims, 11 Drawing Sheets

LIGHT-GENERATING SYSTEM

This application claims the benefit of U.S. Provisional Patent Application No. 61/185,731, filed Jun. 10, 2009, and incorporates such provisional application in its entirety by reference.

FIELD OF THE INVENTION

The present invention is a light-generating system.

BACKGROUND OF THE INVENTION

As is well known in the art, light-emitting diodes ("LEDs") are more efficient than incandescent light bulbs, i.e., more light is produced per watt by an LED than by an incandescent bulb. Other known electrically-powered light sources, e.g., fluorescent light bulbs, have a number of disadvantages, as is well known in the art. For example, fluorescent light bulbs are required to be replaced relatively frequently. Where they are used in streetlights, this can involve significant expenses.

LEDs have a number of additional advantages. However, as is well known in the art, LEDs require relatively close control of voltage and current and also heat management. For example, because current through the LED is dependent exponentially on voltage, voltage should be closely controlled. Also, the voltage supplied should be sufficient, at a minimum, to cause current to flow in the proper direction (i.e., from p-type to n-type material). In addition, the ambient temperature of the operating environment can significantly affect the performance of LEDs.

Although LEDs have certain advantages when compared to incandescent or fluorescent bulbs (e.g., lower power consumption, and longer operating time) LEDs also have certain disadvantages, as noted above.

SUMMARY OF THE INVENTION

For the foregoing reasons, there is a need for an improved light-generating system, in which one or more of the disadvantages of the prior art are addressed or mitigated.

In its broad aspect, the invention provides a light-generating system for consuming input electrical power from a power source to generate light. The light-generating system includes a LED load array with a plurality of light-emitting diodes, the light-emitting diodes having an operating temperature when energized, and a heat sink on which the LED load array is mounted, the heat sink being adapted for absorbing and dissipating heat energy generated by the light-emitting diodes when energized. The heat sink includes a body portion to which the light-emitting diodes are attached, and a finned portion connected to the body portion, for dissipation of heat energy transferred thereto at least partially via conduction from the light-emitting diodes, to cool the light-emitting diodes. The system also includes a power control unit electrically connected to the power source and the LED load array, for converting the input electrical power to an output electrical power and controlling voltage and current of the output electrical power provided by the power control unit to the LED load array. In addition, the system includes a temperature detector subassembly operatively connected to the power control unit, the temperature detector subassembly being adapted for sensing a heat sink temperature of the heat sink at one or more predetermined locations thereon.

The temperature detector subassembly is adapted to compare the heat sink temperature to one or more preselected temperatures within a preselected temperature range, and to transmit a control signal to the power control unit upon determining that the heat sink temperature differs from said at least one preselected temperature by more than a preselected minimum difference.

Upon receipt of the control signal, the power control unit changes the voltage of the output electrical power, to modulate the performance of the light-emitting diodes such that the heat sink temperature is within the preselected temperature range.

In one of its aspects, the preselected temperature includes an upper limit preselected temperature, and the preselected minimum difference includes an upper limit minimum difference.

In another aspect, upon the temperature detector subassembly determining that the heat sink temperature is greater than the upper limit preselected temperature by at least the upper limit minimum difference, the temperature detector subassembly sends the control signal to the power control unit, for causing the power control unit to decrease the output electrical power to lower the heat sink temperature until the heat sink temperature is within the preselected temperature range.

In yet another aspect, the control signal causes the voltage of the output electrical power to decrease to an extent required by the control signal.

In yet another of its aspects, the power control unit of the invention includes a microprocessor and a current sensor, for determining current data associated with the output electrical power and communicating the current data to the microprocessor.

In another aspect, the invention additionally includes an ambient light controller for controlling the electrical power provided to the LED load array, in indirect proportion to ambient light intensity.

BRIEF DESCRIPTION OF THE DRAWINGS

The invention will be better understood with reference to the attached drawings, in which.

DETAILED DESCRIPTION

In this specification and in the claims that follow, "LED" means a light-emitting diode. In the attached drawings, like reference numerals designate corresponding elements throughout. Reference is first made to FIGS. 1A-4A to describe an embodiment of a light-generating system of the invention indicated generally by the numeral 20. The light-generating system 20 is for consuming input electrical power from a power source (not shown) to generate light. Preferably, the light-generating system 20 includes a LED load array 22 with a number of light-emitting diodes 23, which have an operating temperature when energized. The system 20 also preferably includes a heat sink 24 on which the LED load array 22 is mounted. The heat sink 24 is adapted for absorbing and dissipating heat energy generated by the light-emitting diodes 23, when they are energized. It is preferred that the heat sink 24 includes a body portion 25 to which the light-emitting diodes 23 are attached, and a finned portion 26 connected to the body portion 25, for dissipation of heat energy transferred thereto at least partially via conduction from the light-emitting diodes 23, to cool the light-emitting diodes 23. In addition, the system 20 preferably includes a power control unit 28 electrically connected to the power source and the LED load array 22, for converting the input electrical power to an output electrical power, and for controlling voltage and current of the output electrical power provided by the power control unit 28 to the LED load array 22. In one embodiment, the system 20 preferably also includes a temperature detector subassembly 30 operatively connected to the power control unit 28. The temperature detector subassembly 30 is adapted for sensing a heat sink temperature of the heat sink 24 at a predetermined location thereon. As will be described, the temperature detector subassembly 30 preferably is also adapted to compare the heat sink temperature to one or more preselected temperatures within a preselected temperature range, and to transmit a control signal to the power control unit 28 upon determining that the heat sink temperature differs from the preselected temperature by one or more preselected minimum differences. Upon receipt of the control signal, the power control unit 28 changes the voltage of the output electrical power, to modulate the performance of the light-emitting diodes so that the heat sink temperature is within the preselected temperature range.

Figure 1A:
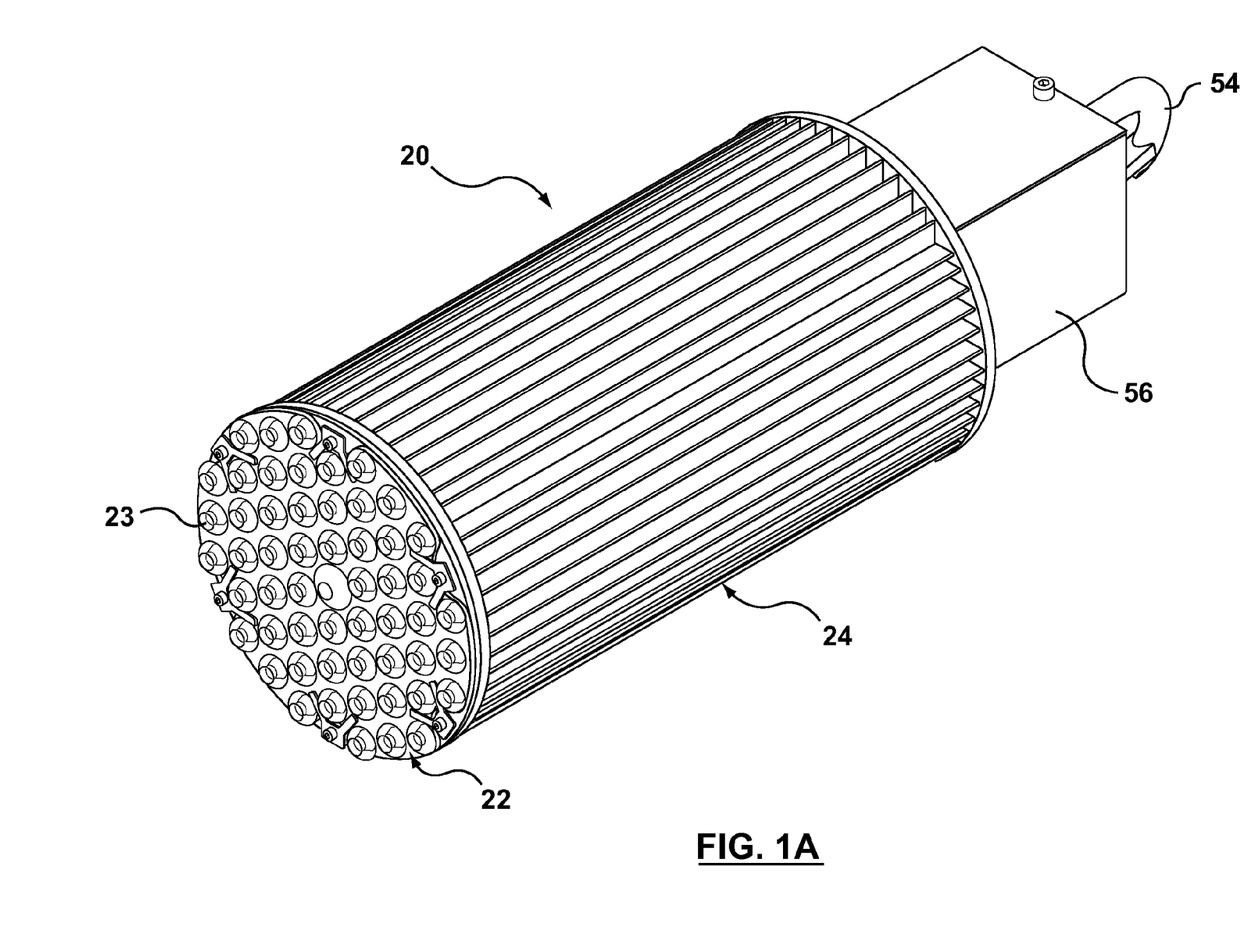
FIG. 1A is an isometric view of an embodiment of a light-generating system of the invention.
Figure 1B:
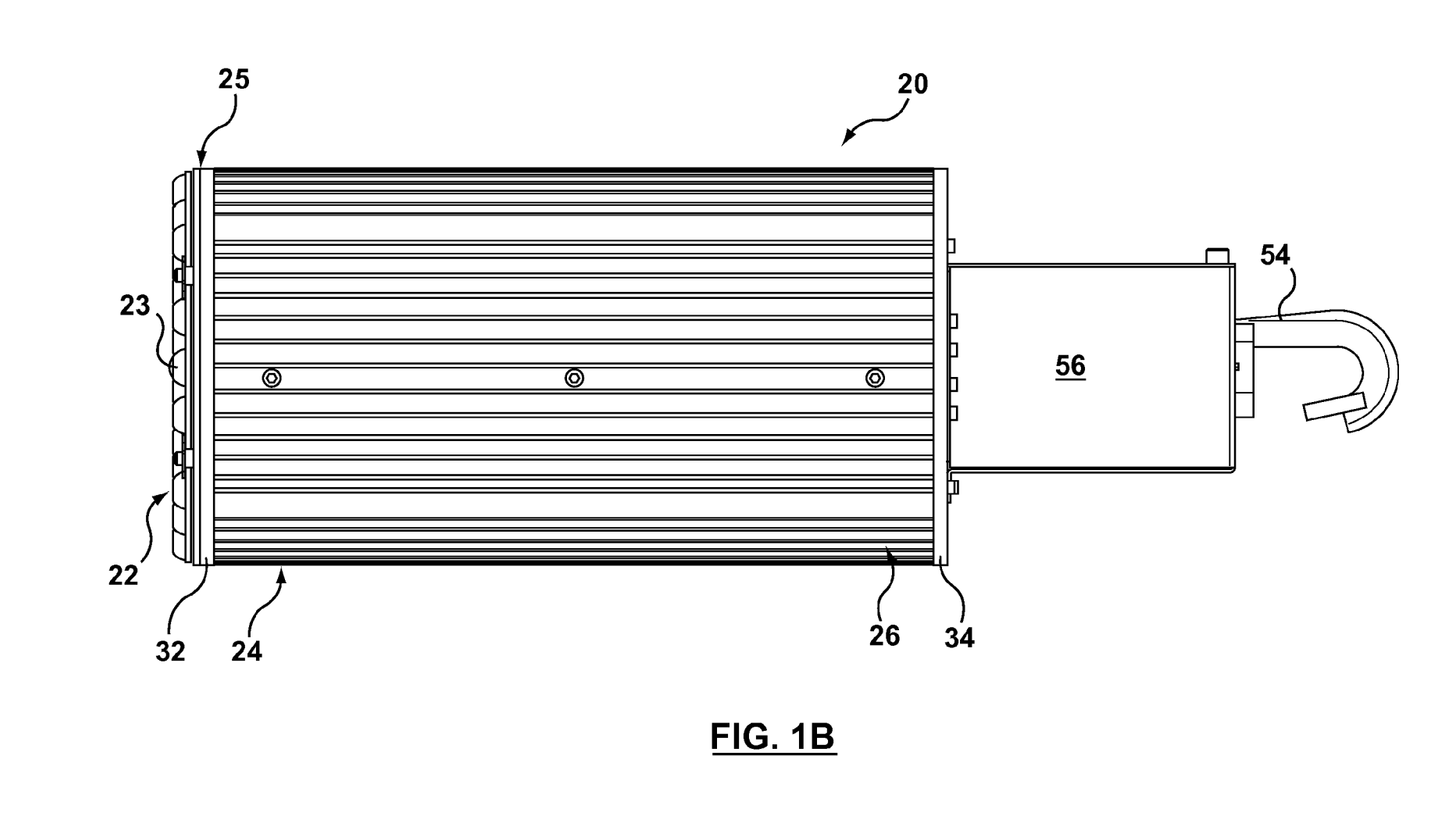
FIG. 1B is a side view of the light-generating system of FIG. 1A.
Figure 2:
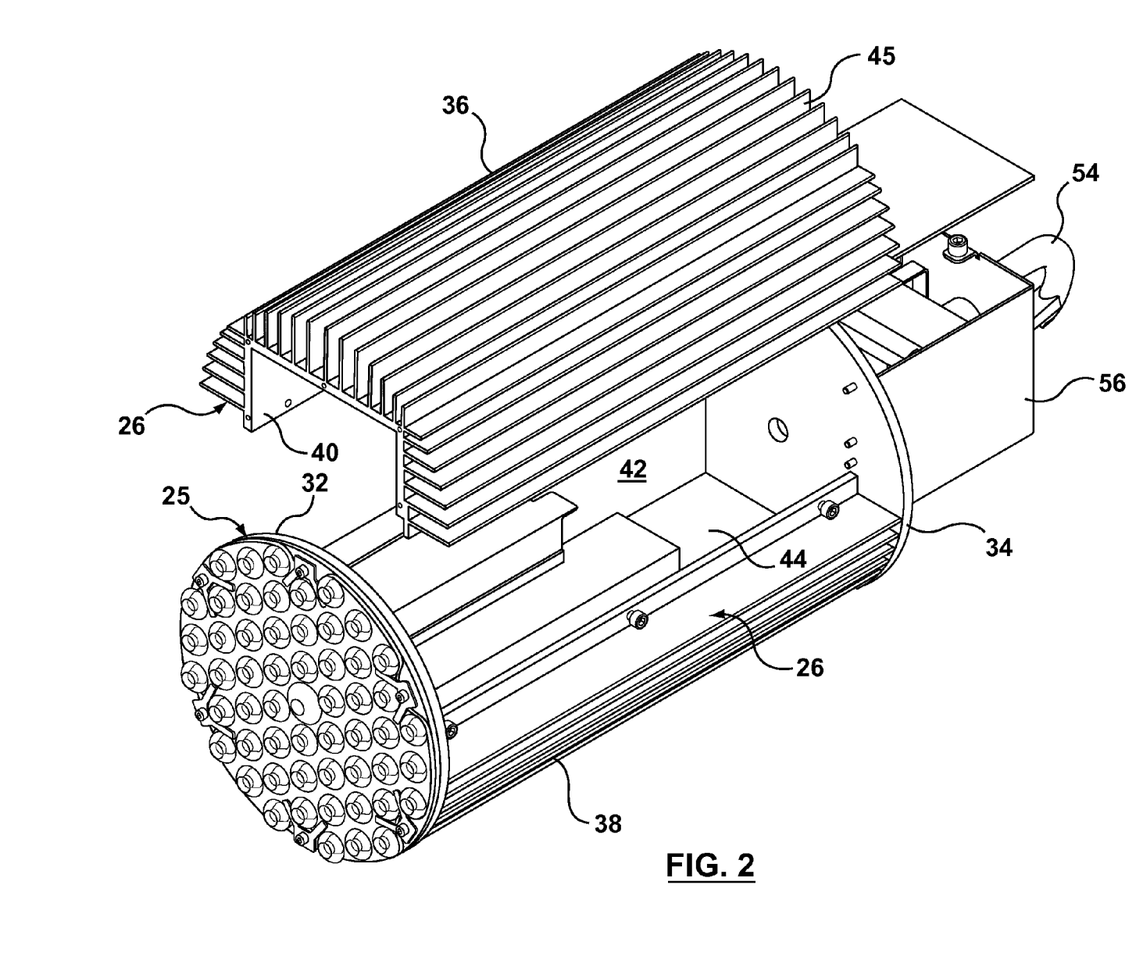
FIG. 2 is an exploded view of the light-generating system of FIG. 1A.
Figure 3A:
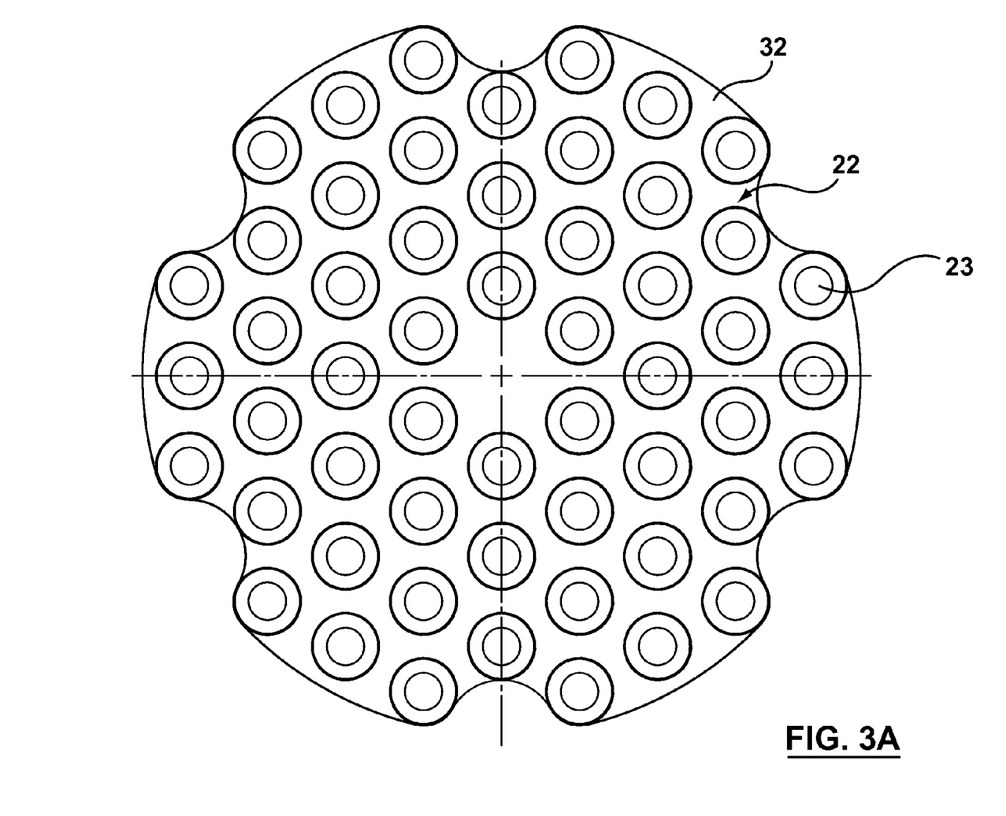
FIG. 3A is a plan view of a bottom plate subassembly of the light-generating system of FIG. 1A, drawn at a larger scale.
Figure 3B:
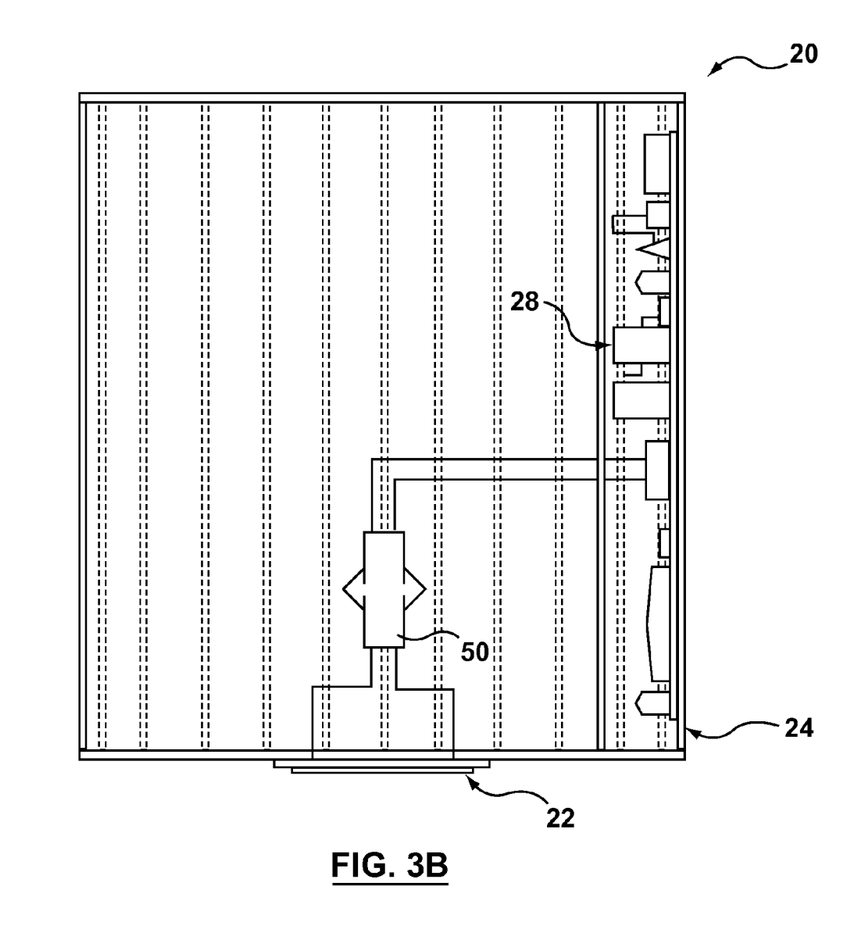
FIG. 3B is a schematic illustration of the light-generating system of FIG. 1A.

As can be seen in FIGS. 1A-3A, in one embodiment, the body portion 25 of the heat sink 24 preferably includes first and second end plates 32, 34 to which the finned portion 26 is attachable (FIG. 2). Preferably, the end plates 32, 34 are substantially round in plan view thereof, with substantially the same diameter. As shown in FIG. 2, it is preferred that the finned portion 26 includes first and second parts 36, 38 which, when attached to the end plates 32, 34, define a generally cylindrical shape overall. Each of the first and second parts 36, 38 includes an interior surface 40, 42 (FIG. 2). It will be understood that, when the heat sink 24 is assembled, the interior surfaces 40, 42 and the end plates 32, 34 at least partially define a cavity 44 in which certain elements (e.g., the power control unit 28) are positionable. For instance, as schematically illustrated in FIG. 3B, the power control unit 28 preferably is mounted on one or more of the interior surfaces 40, 42.

The heat sink 24 preferably includes any suitable heat dissipation means. For example, depending on the application, one or more heat pipes may be suitable. However, it is preferred that the heat sink 24 includes fins 45 which extend outwardly from the finned portion 26 for heat exchange with the ambient atmosphere, to dissipate heat to the ambient atmosphere. Preferably, the fins 32 are formed for optimal heat transfer characteristics. It will be appreciated by those skilled in the art that the heat sink preferably is made of material with relatively high thermal conductivity. For example, the heat sink 24 preferably is made of extruded aluminum.

Figure 4A:
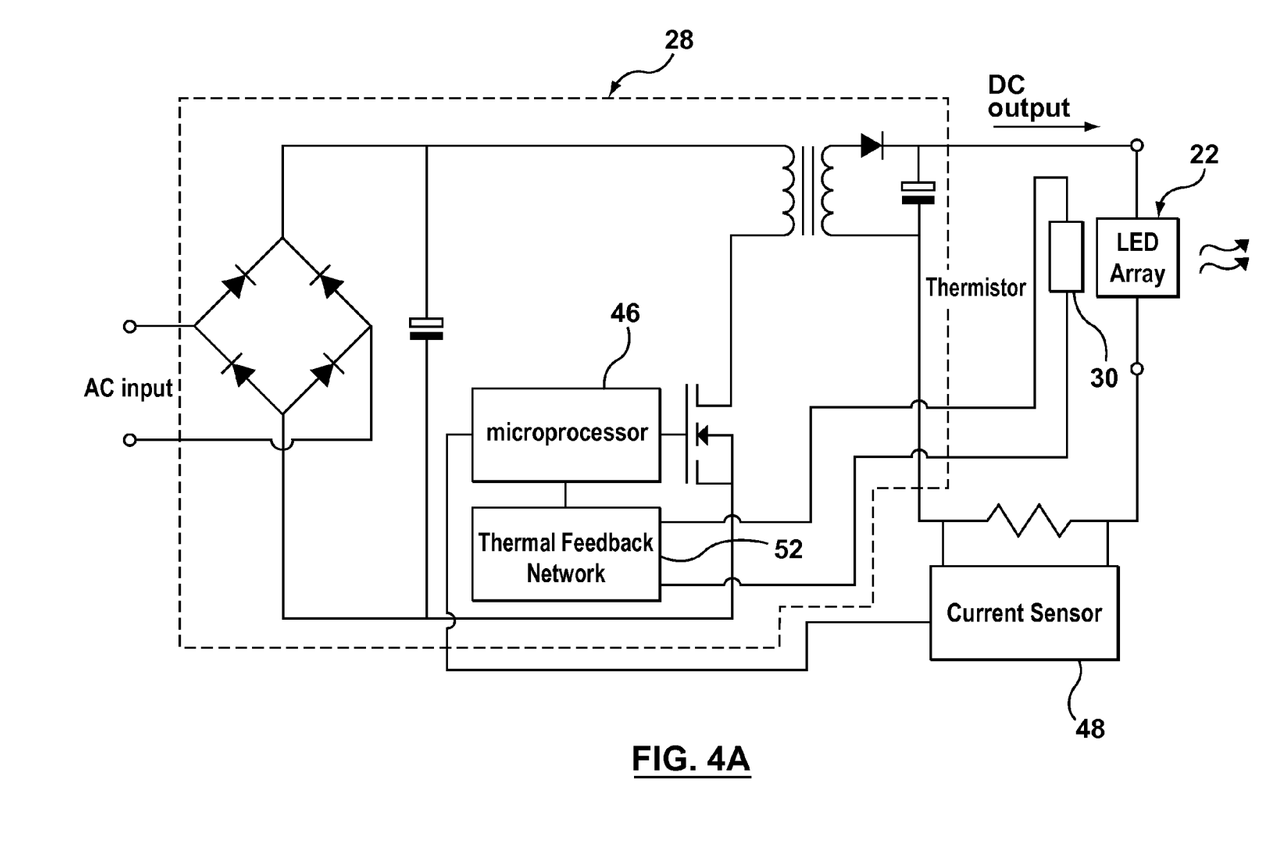
FIG. 4A is a schematic diagram illustrating the light-generating system of FIGS. 1A-3.

It is preferred that the power control unit 28 includes a microprocessor 46 and a current sensor 48, for determining current data associated with the output electrical power and communicating the current data to the microprocessor 46 (FIG. 4A).

The power control unit 28 preferably provides a current-regulated and voltage-regulated power supply to the LED load array 22. Preferably, the components of the power control unit 28 are included in a highly integrated single power/controller board design (i.e., a printed circuit board ("PCB")), which is a microprocessor-based control system that fits within the heat sink 24. In one embodiment, the power control unit 28 and other elements of the light-generating system 20 preferably are adapted for 50 W or 100 W rated output, as selected by the user. Preferably, the power control unit 28 is set for either 50 W or 100 W when it is manufactured. This arrangement reduces manufacturing costs. Other possible power outputs will occur to those skilled in the art.

It is also preferred that the system 20 includes a connector 50, for electrically connecting the LED load array 22 to the power control unit 28. The connector 50 preferably is adapted for quick connection and disconnection, to permit relatively quick replacement of a used LED load array 22.

The light-generating system 20 preferably includes continuous diagnostics for supply, lamp load condition and system functionality. The power measurement and control capability of the power control unit 28 leads to a relatively longer operational life of the LED load array 22.

Preferably, the microprocessor 46 is for monitoring and controlling various aspects of the performance of the power control unit 28 and/or the light-generating system 20 overall. In particular, the microprocessor 46 receives data about the current and voltage provided to the LED load array 22, compares such measured current and voltage to rated current and voltage, and initiates appropriate action if the measured current and voltage vary from the rated values therefor by more than predetermined differences respectively. Preferably, the output electrical power is controlled via pulse width modulation. It is preferred that voltage is monitored within the microprocessor 46. Current preferably is sensed by the sensor 48, and data in this regard is provided to the microprocessor 46. The microprocessor 46 then directs the pulse lengths accordingly. The microprocessor 46 continuously processes such data at very short time intervals.

The LED driver 28 sets the voltage applied to the LED load array 22 in a variable fashion, where the microprocessor 46 adjusts the voltage slightly up or down within a given range in order to sense the predetermined current flow. The current flow is measured by a very low resistance power resistor (usually 0.1 Ohms) sensing a very small voltage drop across it (in milli-volts). This measurement is then amplified and put on a feedback to the microprocessor 46 so that it can adjust the potential of the pulses it feeds the output to attempt to match the pre-determined voltage drop across the current sensing resistor.

From the foregoing, it can be seen that the power control unit 28 is used to control the voltage applied to the LED load array 22. However, unlike traditional supplies, an absolute output voltage is not set, but instead the applied voltage is set relative to the drop across a current-sensing resistor, as described above.

In addition, the light-generating system 20 has an overall power efficiency of at least 86 percent, a relatively high efficiency. (Prior art units typically average from 70 percent to 75 percent power efficiency.) The light-generating system 20 preferably has the full operational input range of 85-480 VAC.

In one embodiment, the light-generating system 20 preferably is adapted to automatically shut itself down immediately upon sufficiently unusual conditions being detected. For example, as the system 20 includes elements thereof adapted for measurement of current and voltage, if the current or voltage supplied is not within predetermined ranges, then the system 20 shuts down upon detection of the unusual conditions. If the applied voltage does not remain within its regulation parameters, then the system is shut down. Similarly, if the current supplied by the pulsing is insufficient to power the load, then the system 20 shuts itself down. Insufficient current may indicate that the system has a short circuit condition.

In addition, the light-generating system 20 preferably includes an automatic recovery function, pursuant to which the system 20 reboots itself if necessary. For instance, in the event of a complete failure of the power supply to the light-generating system 20, the system 20 reboots itself once the power supply is restored.

In one embodiment, the light generating system 20 preferably includes the temperature detector subassembly 30 (FIG. 4A) operatively connected to the power control unit 28 via a thermal feedback network 52 (FIG. 4A). Those skilled in the art will be aware that the temperature detector subassembly may include various temperature-detecting elements. It is preferred that the temperature-detecting element in the temperature detector subassembly 30 is a thermistor. The temperature detector subassembly 30 is for sensing a temperature of the heat sink 24. If the temperature differs from a preselected temperature by more than a predetermined extent, then the thermistor 30 provides an increasing signal to the power control unit 28, for increasing the electrical power supplied to the LED load array 22, or the thermistor 30 provides a decreasing signal to the power control unit 28, for decreasing the electrical power supplied to the LED load array 22, as the case may be. The thermistor 30 is adapted to take the ambient temperature into account. Because the thermistor 30 is included in the system 20, a somewhat smaller heat sink 24 may be used than otherwise would be selected for the light-generating system.

It will be understood that, in practice, the location on the heat sink 24 at which the temperature thereof is detected preferably should be relatively proximal to the light-emitting diodes 23. For instance, it is preferred that the thermistor 30 is connected to the heat sink 24 for detection of the temperature thereof at the end plate 32. Those skilled in the art will appreciate that, in determining the temperatures which trigger the generation of control signals, the thermal conductivity of the heat sink 24 and the distance of the location at which temperature is detected is from the light-emitting diodes is taken into account.

In general, the power control unit 28 is required to lower the temperature of the heat sink. In one embodiment, the preselected temperature is an upper limit preselected temperature and/or a lower limit preselected temperature. Also, it is preferred that the preselected minimum difference is, when compared to the upper limited preselected temperature, an upper limit minimum difference, and when the operating temperature is compared to the lower limit preselected temperature, a lower limit minimum difference.

Preferably, upon the temperature detector subassembly 30 determining that the heat sink temperature is greater than the upper limit preselected temperature by at least the upper limit minimum difference, the temperature detector subassembly 30 sends the control signal to the power control unit 28, to cause the power control unit 28 to decrease the output electrical power to lower the heat sink temperature until the heat sink temperature is within the preselected temperature range. The control signal preferably causes the voltage of the output electrical power to be decreased to an extent required by the control signal.

Preferably, upon the temperature detector subassembly 30 determining that the heat sink temperature is less than the lower limit preselected temperature by at least the lower limit minimum difference, the temperature detector subassembly sends the control signal to the power control unit 28, to cause the power control unit 28 to increase the output electrical power to raise the heat sink temperature until the heat sink temperature is within the preselected temperature range. The control signal preferably causes the voltage of the output electrical power to be increased to an extent required by the control signal.

It will be appreciated by those skilled in the art that the light-generating system 20 may be mounted in any suitable manner. Although many alternative arrangements are possible, in one embodiment, the system 20 preferably includes a hook element 54, to enable the system 20 to be suspended by the hook element 54 attached to a suitable part of a building or other structure (not shown). Input electrical power preferably is provided via any suitable means, e.g., a suitable insulated power cord (not shown). As can be seen in FIGS. 1A-2, the system 20 preferably includes a connection box 56 secured to the heat sink 24 in which the wiring (not shown) for connection with outside feed is located. In one embodiment, the hook element 54 is attached to the connection box 56. It is preferred that the system not be mounted directly into a standard socket (e.g., a socket for accepting an E39 base) due to a requirement for a standards body's approval of both the socket and the light-generating system mounted in such socket.

In use, the system 20 is positioned as required, e.g., suspended by the hook element 54, and the input electrical power is provided to the system 20 via any suitable means therefore. The light-emitting diodes preferably are fitted with one or more suitable lenses (not shown) for any particular application. For example, in view of the distance above a floor at which the light-emitting diodes are positioned, and the area to be illuminated, lenses with certain characteristics would be preferred. Once connected, the input electrical power is provided to the power control unit 28. The power control unit 28 controls the voltage and current of the electrical power which is provided to the LED load array, so that it is within the appropriate parameters for safe operation of the LED load array. Among other things, if the input electrical power is AC, then AC current is rectified (to DC current) by the power control unit. Once the LED load array is operating, the heat sink dissipates heat, to provide a temperature within a predetermined operating range of the LED load array.

As described above, the thermistor preferably provides signals to the power control unit 28 to control the voltage of the output electrical power provided to LED load array 22, in order to maintain the heat sink temperature within a predetermined range, in real time.

The light-generating system 20 is relatively robust, as all wiring and connectors are generally located inside the heat sink 24, except for the power cord or other wiring for connection to an external power source. The heat sink 24 preferably also acts as a heat sink for the power control unit 28. Preferably, the power control unit 28 is attached directly to an interior surface of the heat sink 24, and positioned in the cavity 44 inside the heat sink 24.

For reliability, it is preferred that the light-omitting diodes 23 are divided into a number of pairs of individual light-emitting diodes connected in series, and the pairs are connected in parallel. For example, in one embodiment, the LED load array 22 preferably includes 54 light-emitting diodes 23 divided into 27 pairs, and the 27 pairs are connected in parallel. This arrangement is intended to result in greater reliability. If one light-emitting diode fails, then only the other light-emitting diode in that pair ceases to function as a result, because only such other light-emitting diode in that pair is connected in series to the failed light-emitting diode.

Figure 4B:
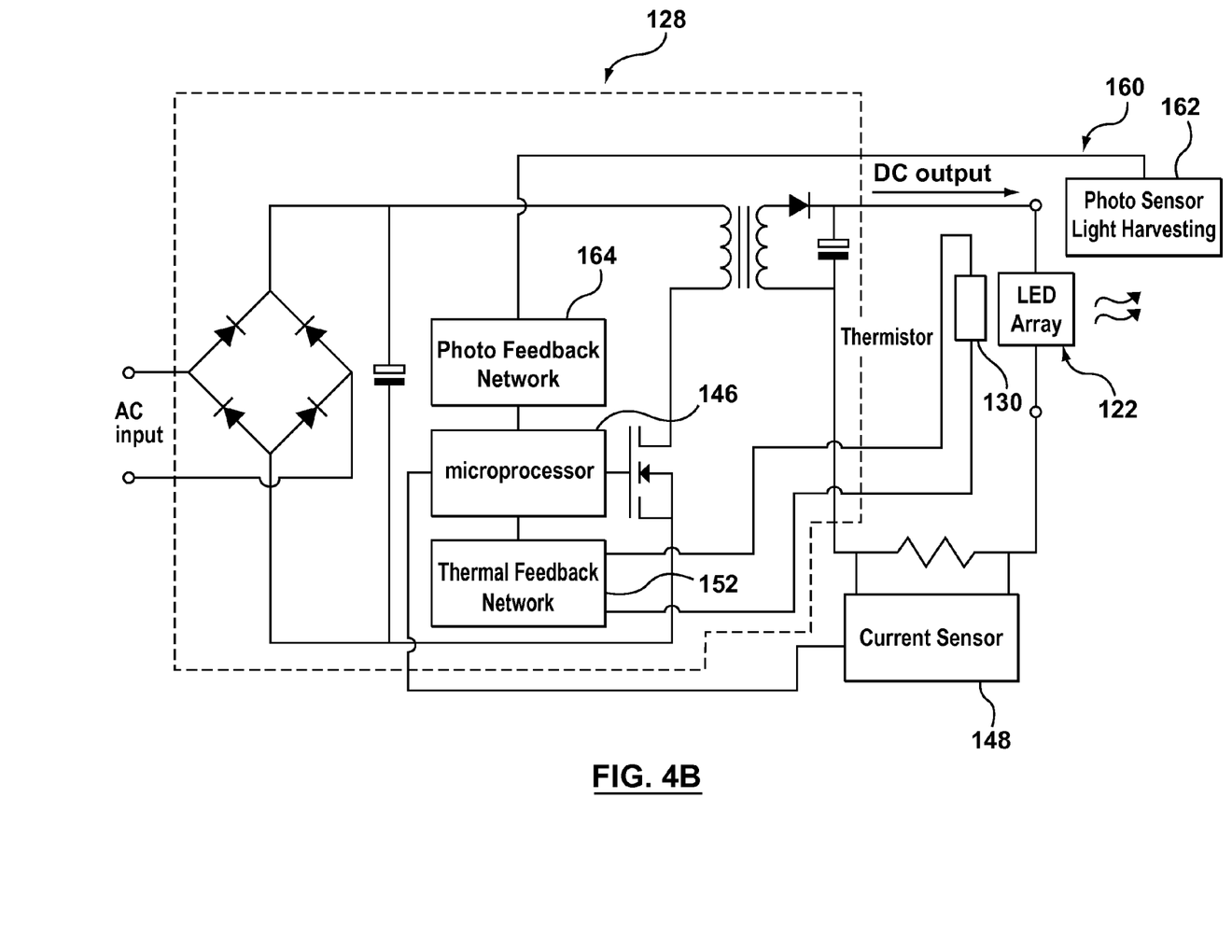
FIG. 4B is a schematic diagram illustrating an alternative embodiment of the light-generating system of the invention.

In one embodiment, the light-generating system 120 preferably additionally includes an ambient light controller 160 for controlling the electrical power supplied to the LED load array 122, in indirect proportion to ambient light (FIG. 4B). The ambient light controller 160 preferably includes an ambient light sensor 162 and a photo feedback network 164. The sensor 162 notifies the feedback network 164 of changes in ambient light, and this data is provided to the microprocessor 146. The microprocessor 146 is adapted to compare ambient light levels to predetermined light levels and to determine whether additional electrical power is required to be provided to the LED load array 122 (i.e., if ambient light is below a predetermined lower level) or, alternatively, whether the electrical power supplied to the LED load array 122 should be decreased (i.e., if ambient light is greater than a predetermined upper level). (It will be understood that "ambient light" to which a particular light-generating system 120 is exposed would also include, for instance, light produced by the LEDs in other light-generating systems positioned nearby.) Preferably, the power control unit 128 (FIG. 2B) includes the pulse width modulator in the microprocessor 146 for "slowing down" (or, if necessary, "speeding up") the current provided to the LED load array 122, thereby causing the LED load array 122 to provide less or more light, i.e., as required in indirect proportion to the ambient light.

In short, where the system of the invention includes an ambient light controller, the electrical power provided to the LED load array via the power control unit is controlled, in indirect proportion to ambient light. Accordingly, the light-generating system 122 has complex dimming and startup functionality, thereby providing improved efficiency in mornings, evenings, and at other times when the ambient light is changing.

Figure 5:
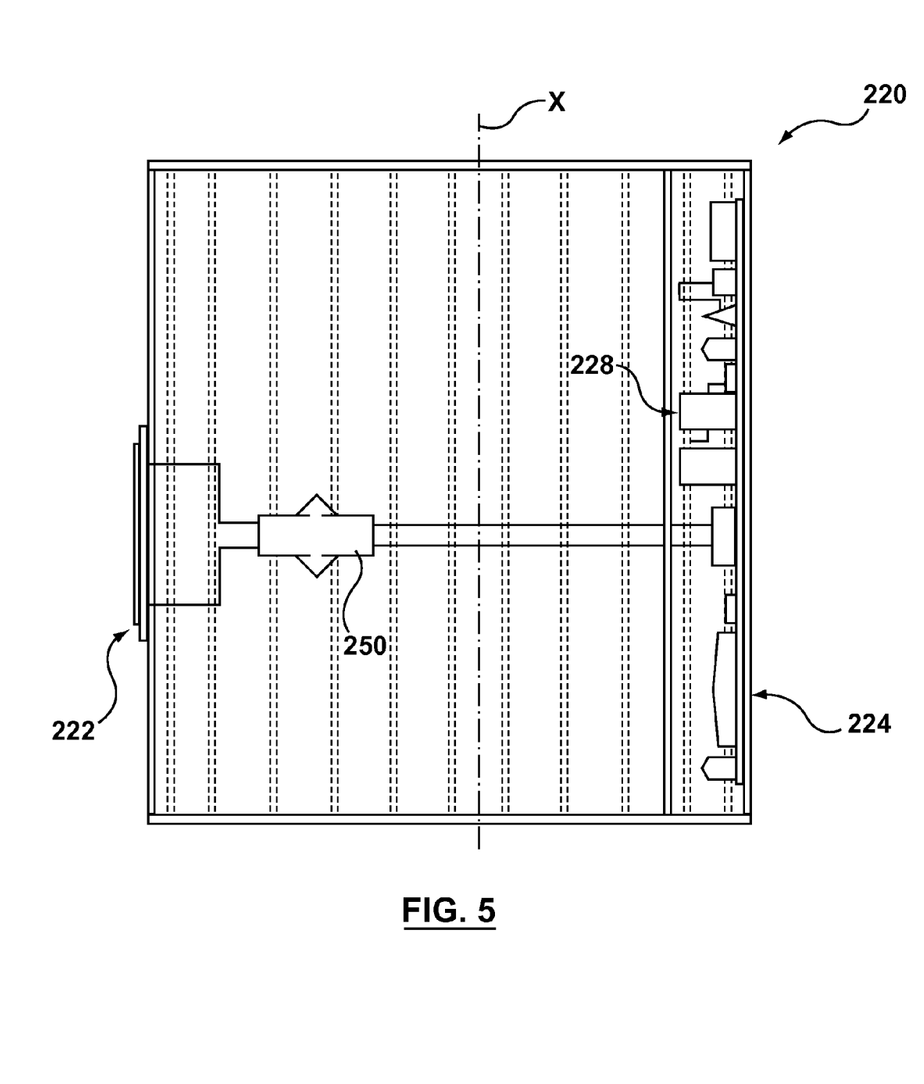
FIG. 5 is a schematic illustration of another alternative embodiment of the light-generating system of the invention.

An alternative embodiment of the light-generating system 220 of the invention is shown in FIG. 5. As can be seen in FIG. 5, in the light-generating system 220, a LED load array 222 is mounted on a side 268 of the heat sink 224. The light-generating system 220 is intended for use where the light fixture (not shown) in which the light-generating system is to be used positions the light-generating system so that light is directed from the light-generating system in a direction which is substantially transverse to the axis (identified as "X" in FIG. 5) defined by the heat sink 224, e.g., for "cobra" style streetlights or parking lot lights.

Figure 6:
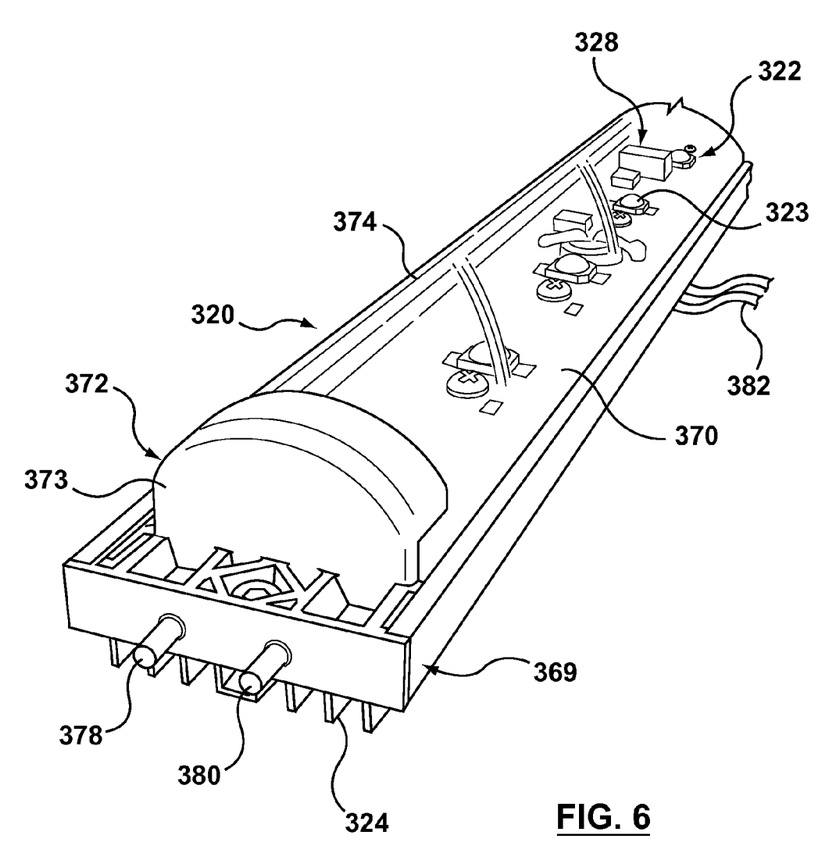
FIG. 6 is an isometric view of an alternative embodiment of the light-generating system of the invention, drawn at a smaller scale.

An alternative embodiment of a light-generating system 320 of the invention is illustrated in FIGS. 6-8B. As can be seen in FIG. 6, the light-generating system 320 includes a base 369 with a heat sink 324 on which a power control unit 328 (including a printed circuit board 370) is positioned. Preferably, the light-emitting diodes 323 in a LED load array 322 are positioned on the printed circuit board 370, at suitable intervals along the length of the base 369. The light-generating system 320 also includes end caps 372 positioned at each end of the base 369.

Each end cap 372 preferably includes a body portion 373 positioned to assist in holding a cover 374 in position. Preferably, each end cap 372 includes two prongs 378, 380 extending from the body portion 373. The prongs 378, 380 are formed to be receivable in the holes in a typical light fixture for a fluorescent light tube (not shown). It will be understood that the prongs 378, 380 are made of an electrical insulator (e.g., a suitable plastic, such as polyethylene), and so the prongs 378, 380 do not conduct electricity. The connection of the system 320 to a power source (not shown) preferably is via wires 382.

Figure 7:
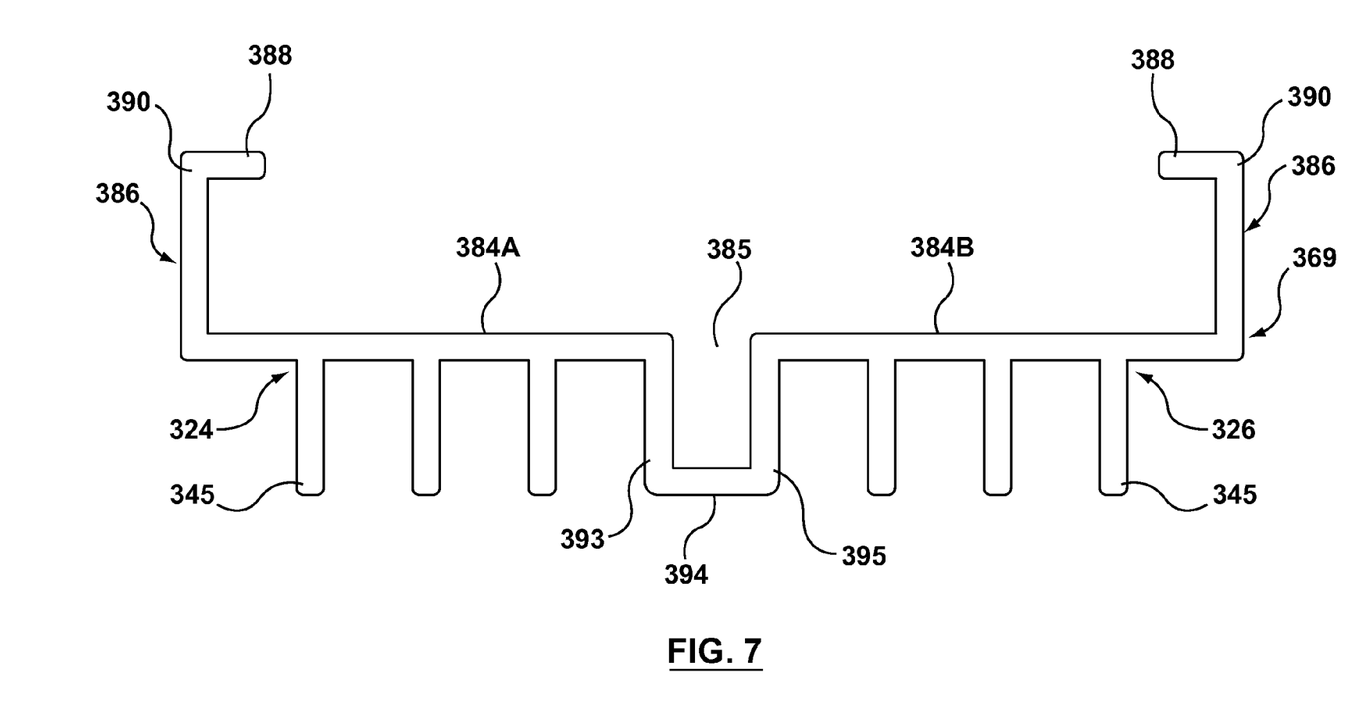
FIG. 7 is an end view of a base of the light-generating system of FIG. 6, drawn at a larger scale.

Preferably, the light-generating system 320 is formed to fit into a conventional fluorescent tube light fixture. Accordingly, the heat sink 324 is elongate, and the LED load array 322 is positioned on the PCB 370 which preferably is secured directly to the heat sink 324 so that the LED load array 322 will direct light downwardly from the conventional light fixture, when the system 320 is positioned in the conventional fixture (not shown) and energized. As can be seen in FIG. 7, the base 369 preferably includes a finned portion 326, with fins 345 extending outwardly, for heat dissipation. The heat sink preferably includes substantially flat regions 384A, 384B on which the PCB 370 is attachable. It is preferred that the base 369 also includes a channel 385 positioned centrally along the length of the base 369, between the flat regions 384A, 384B. The channel 385 is at least partially defined by walls 393, 394, 395 (FIG. 7). Certain elements of the power control unit 328 (e.g., the microprocessor) preferably are positioned in the channel 385, to protect such elements, and also for dissipation of heat therefrom. The light-emitting diodes 323 preferably are mounted on a strip (not shown) which preferably is also at least partially positioned in the channel 385, for dissipation of heat therefrom.

Preferably, the base 369 also includes side portions 386 with transverse parts 388 at ends 390 of the side portions 386. As can be seen in FIG. 6, the light-generating system 320 includes the substantially transparent cover 374 which is held in position on the heat sink 324 between the side portions 386. The cover 374 preferably is made of any suitable flexible transparent or translucent material such as those skilled in the art would be aware of. Preferably, the cover 374 is made of a suitable acrylic. However, if the system is to be used in a harsh environment, the cover 374 preferably is made of polycarbonate, which would withstand shocks better than acrylic.

Figure 8A:
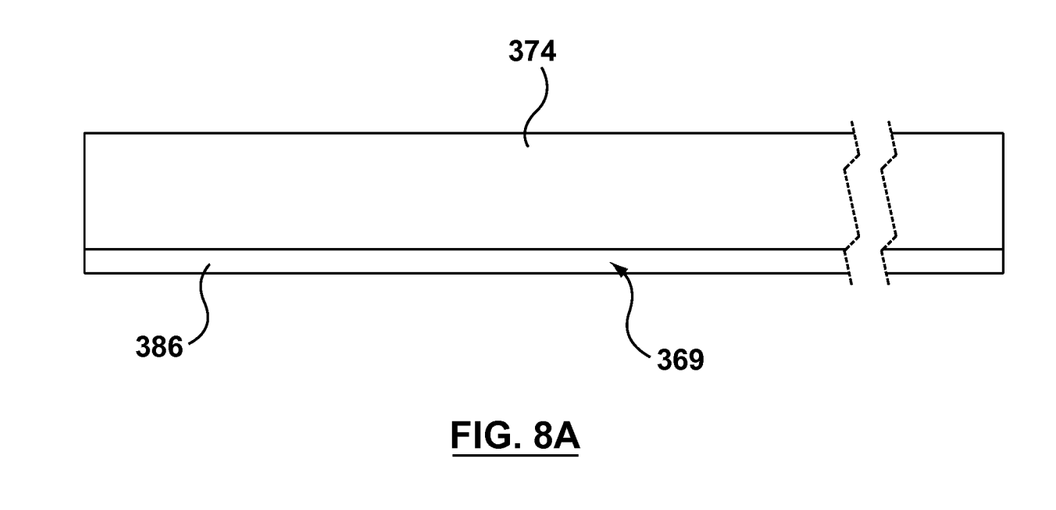
FIG. 8A is a side view of selected elements of the light-generating system of FIG. 6, drawn at a smaller scale.
Figure 8B:
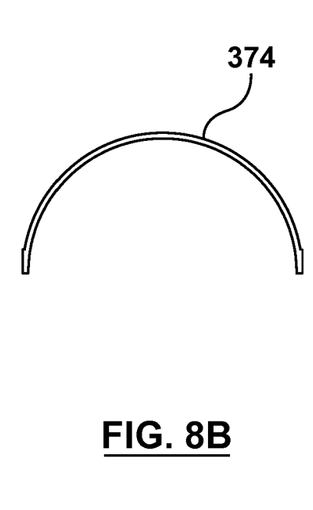
FIG. 8B is an end view of a cover of the light-generating system of FIG. 6, drawn at a larger scale.

It is also preferred that the cover 374 (also shown in FIGS. 8A and 8B) is formed so that it is subjected to tension when folded (as shown in FIG. 8B) and held between the side portions 386. Because the cover 374 is subjected to tension when it is held in this way between the side portions 386, the cover 374 is held in position when the light-generating system 320 is in position in the conventional fluorescent light tube fixture. The cover 374 is also partially held in place on the base 369 by the transverse parts 388, which engage the cover 374. (It will be understood that the end caps 372 are intentionally omitted from FIG. 8A for clarity of illustration.)

In operation, the light-generating system 320 functions generally the same as the system 20, described above. Input electrical power, if AC, is rectified by the power control unit 328, and the output electrical power is changed or modified by the power control unit 328 in response to information provided by a thermistor (not shown), which monitors temperature of the heat sink 324 at a predetermined location. Optionally, the light-generating system 320 may additionally include an ambient light controller (not shown), functioning as in the system 120, described above.

As noted above, the light-generating system 320 preferably is configured to fit into a conventional fluorescent light tube fixture, although the power supply is not provided via such fixture. It will be appreciated by those skilled in the art that the system 320 may be conveniently used to retrofit with LEDs, with minimal rewiring required.

It will be appreciated by those skilled in the art that the invention can take many forms, and that such forms are within the scope of the invention as described above. The foregoing descriptions are exemplary, and their scope should not be limited to the preferred versions provided therein.

I claim:

1. A light-generating system for consuming input electrical power from a power source to generate light, the light-generating system comprising:
   a LED load array comprising a plurality of light-emitting diodes, the light-emitting diodes having an operating temperature when energized;
   a heat sink on which the LED load array is mounted, the heat sink being adapted for absorbing and dissipating heat energy generated by the light-emitting diodes when energized, the heat sink comprising:
      a body portion to which the light-emitting diodes are attached;
      a finned portion connected to the body portion, for dissipation of heat energy transferred thereto at least partially via conduction from the light-emitting diodes, to cool the light-emitting diodes;
   a power control unit electrically connected to the power source and the LED load array, for converting the input electrical power to an output electrical power and controlling voltage and current of the output electrical power provided by the power control unit to the LED load array;
   a temperature detector subassembly operatively connected to the power control unit, the temperature detector subassembly being adapted for sensing a heat sink temperature of the heat sink at least one predetermined location thereon;
   the temperature detector subassembly being adapted to compare the heat sink temperature to at least one preselected temperature within a preselected temperature range, and to transmit a control signal to the power control unit upon determining that the heat sink temperature differs from said at least one preselected temperature by more than at least one preselected minimum difference; and
   upon receipt of the control signal, the power control unit changes the voltage of the output electrical power, to modulate the performance of the light-emitting diodes such that the heat sink temperature is within the preselected temperature range.

2. A light-generating system according to claim 1 in which the power control unit comprises:
   a microprocessor; and
   a current sensor, for determining current data associated with the output electrical power and communicating the current data to the microprocessor.

3. A light-generating system according to claim 1 additionally comprising an ambient light controller for controlling the electrical power provided to the LED load array, in indirect proportion to ambient light.

4. A light-generating system according to claim 1 in which:
   said at least one preselected temperature comprises an upper limit preselected temperature and a lower limit preselected temperature; and
   said at least one preselected minimum difference comprises an upper limit minimum difference and a lower limit minimum difference.

5. A light-generating system according to claim 4 in which, upon the temperature detector subassembly determining that the heat sink temperature is greater than the upper limit preselected temperature by at least the upper limit minimum difference, the temperature detector subassembly sends the control signal to the power control unit, for causing the power control unit to decrease the output electrical power to lower the heat sink temperature until the heat sink temperature is within the preselected temperature range.

6. A light-generating system according to claim 5 in which the control signal causes the voltage of the output electrical power to decrease to an extent required by the control signal.

7. A light-generating system according to claim 4 in which, upon the temperature detector subassembly determining that the heat sink temperature is less than the lower limit preselected temperature by at least the lower limit minimum difference, the temperature detector subassembly sends the control signal to the power control unit, for causing the power control unit to increase the output electrical power to raise the heat sink temperature until the heat sink temperature is within the preselected temperature range.

8. A light-generating system according to claim 7 in which the control signal causes the voltage of the output electrical power to increase to an extent required by the control signal.

* * * * *